US008298615B2

(12) United States Patent
Luhrs et al.

(10) Patent No.: US 8,298,615 B2
(45) Date of Patent: Oct. 30, 2012

(54) RAPID GENERATION OF CARBON FILAMENT STRUCTURES OF CONTROLLED GEOMETRIES AT LOW TEMPERATURES

(75) Inventors: Claudia Catalina Luhrs, Rio Rancho, NM (US); Marwan Al-Haik, Albuquerque, NM (US); Zayd Leseman, Albuquerque, NM (US); Jonathan Phillips, Rio Rancho, NM (US)

(73) Assignee: STC.UNM, Albuquerque, NM (US)

( * ) Notice: Subject to any disclaimer, the term of this patent is extended or adjusted under 35 U.S.C. 154(b) by 808 days.

(21) Appl. No.: 12/355,265

(22) Filed: Jan. 16, 2009

(65) Prior Publication Data
US 2009/0263568 A1 Oct. 22, 2009

Related U.S. Application Data

(60) Provisional application No. 61/022,300, filed on Jan. 18, 2008.

(51) Int. Cl.
*C23C 16/26* (2006.01)

(52) U.S. Cl. ............... 427/249.3; 427/248.1; 427/249.1; 427/75

(58) Field of Classification Search ............... 427/249.3, 427/249.1, 248.1, 75
See application file for complete search history.

(56) References Cited

U.S. PATENT DOCUMENTS

| 5,165,909 | A  | * | 11/1992 | Tennent et al. | ............ 423/447.3 |
| 5,344,709 | A  | * | 9/1994  | Tokutomi et al. | ............ 428/368 |
| 7,338,684 | B1 | * | 3/2008  | Curliss et al. | ................ 427/180 |
| 7,544,546 | B2 | * | 6/2009  | Afzali-Ardakani et al. | .. 438/142 |
| 2006/0198949 | A1 | * | 9/2006  | Phillips et al. | ................ 427/122 |
| 2007/0264764 | A1 | * | 11/2007 | Afzali-Ardakani et al. | .. 438/197 |
| 2008/0248301 | A1 | * | 10/2008 | Ting | ............................. 428/368 |
| 2008/0318049 | A1 | * | 12/2008 | Hata et al. | ..................... 428/408 |

* cited by examiner

*Primary Examiner* — Christina Johnson
*Assistant Examiner* — Saeed Huda
(74) *Attorney, Agent, or Firm* — MH2 Technology Law Group, LLP

(57) ABSTRACT

Exemplary embodiments provide methodologies for generating structures of filamentous carbon (or carbon filaments) with controlled geometries. In one exemplary embodiment of forming the carbon filament structure, a metal template can be exposed to a fuel rich gaseous mixture to form a carbon filament structure at an appropriate gas flow and/or at an appropriate temperature on the metal template. The metal template can have one or more metal surfaces with controlled geometries. Carbon filament structures can then be grown on the metal surfaces having corresponding geometries (or shapes) in the growth direction. The carbon filament structure can be two or three dimensional and can have high density. In various embodiments, the metal template can be removed to leave a self-supporting carbon filament structure.

23 Claims, 2 Drawing Sheets

RAPID GENERATION OF CARBON FILAMENT STRUCTURES OF CONTROLLED GEOMETRIES AT LOW TEMPERATURES

RELATED APPLICATIONS

This application claims priority from U.S. Provisional Patent Application Ser. No. 61/022,300, filed Jan. 18, 2008, which is hereby incorporated by reference in its entirety.

FIELD OF THE INVENTION

This invention relates generally to filament structures and, more particularly, to formation of carbon filament structures with controlled geometries.

BACKGROUND OF THE INVENTION

Special carbon-containing materials may possess exceptional mechanical properties, superior electric and thermal properties. For example, carbon fibers can be used as reinforcement materials for structural composites. Recent research has been focused on graphitic structures with intricate geometries. However, there is a need for methodologies for forming non-graphitic structures such as carbon filament structures.

SUMMARY OF THE INVENTION

According to various embodiments, the present teachings include a method for preparing a filament structure. The filament structure can be formed by first exposing a metal template to a fuel rich gaseous mixture that includes one or more hydrocarbons and at least one oxidizer. To form a filament structure on the metal template, the fuel rich gaseous mixture can have a controlled flow rate to produce a turbulent flow over the exposed metal template; and the fuel rich gaseous mixture and the metal template can be heated.

According to various embodiments, the present teachings also include a method for preparing a filament coated article. In this method, a template that includes one or more catalytic metal surfaces can be placed into a container. A fuel rich gaseous mixture that includes one or more hydrocarbons and at least one oxidizer can be introduced into the container having a flow rate chosen to produce a turbulent flow over the template. The template can then be heated to a temperature chosen to at least partially combust the one or more hydrocarbons, whereby depositing a filament film on each of the one or more catalytic metal surfaces of the template.

According to various embodiments, the present teachings further include a method for preparing a filament coated article The filament coated article can be prepared by first forming a patterned metal template; placing the patterned metal template into a container of a tube furnace; and pretreating the patterned metal template in the container. A fuel rich gaseous mixture including one or more hydrocarbons and oxygen can then be introduced into the container having a flow rate chosen to produce a turbulent flow. The patterned metal template can be heated to at least partially combust the one or more hydrocarbons, whereby a patterned filament film is deposited on the patterned metal template. After that, the container can be cooled in order to freeze the deposition of the filament film.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1A:
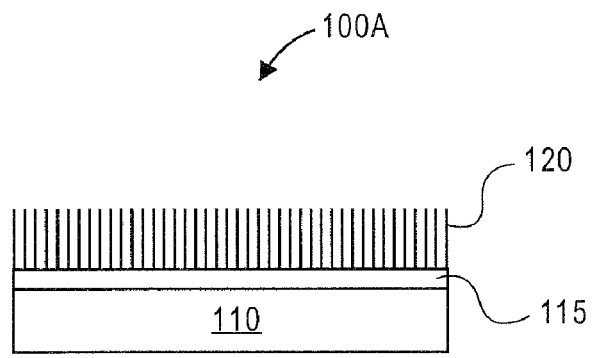
FIG. 1A is a schematic cross-sectional view of an exemplary filament structure formed on a metal template in accordance with the present teachings.

Reference will now be made in detail to the present embodiments (exemplary embodiments) of the invention, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Exemplary embodiments provide methodologies for generating structures of filamentous carbon (or carbon filaments) with controlled geometries. In one exemplary embodiment of forming the carbon filament structure, a metal template can be exposed to a fuel rich gaseous mixture that contains one or more hydrocarbons and at least one oxidizer, whereby the carbon filament structure can be formed or deposited on the metal template at an appropriate gas flow and/or at an appropriate temperature. The metal template can have one or more metal surfaces with controlled geometries, e.g., with controlled morphologies, shapes, structures or patterns, formed on a template substrate. Carbon filament structures can then be grown on metal surfaces and can have corresponding geometries (or shapes) to the metal template in a growth direction. The carbon filament structure can be two or three dimensional and can have high density. In various embodiments, the metal template can be removed to leave a self-supporting carbon filament structure.

Figure 1B:
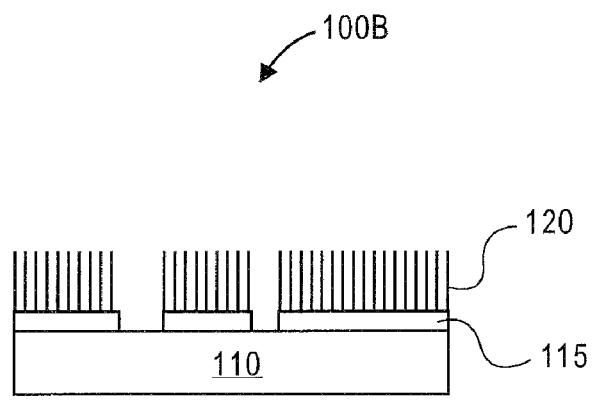
FIG. 1B is a schematic cross-sectional view of exemplary filament structures formed on a patterned metal template in accordance with the present teachings.

FIG. 1A is a schematic cross-sectional view of an exemplary filament structure 120 (e.g., woven carbon filament structures) formed on a metal template 115 in accordance with the present teachings The metal template 115 can be formed on a template substrate 110. FIG. 1B is a schematic cross-sectional view of exemplary filament structures 120 (e.g., woven carbon filament structures) formed on surfaces of a patterned metal template 115 in accordance with the present teachings. As shown in FIGS. 1A-1B, each filament structure 120 can include a plurality of carbon filaments formed from underlying surfaces of the metal template 115.

Although the plurality of carbon filaments of each filament structure 120 is depicted having a consistent size in FIGS. 1A-1B, one of ordinary skill in the art will understand that the carbon filaments can have different densities, different shapes, and/or different sizes for example, different lengths, widths and/or diameters. In addition, it should be readily apparent to one of ordinary skill in the art that the structures 100A-B depicted in FIGS. 1A-1B represent generalized schematic illustrations and that other layers/structures/components can be added or existing layers/structures/components can be removed or modified.

In various embodiments, the filament structure 120 can include a carbon filament structure, primarily (e.g., >50%) or entirely, formed of filaments of carbon For example, the filament structure 120 can have a plurality of carbon filaments with each filament having an aspect ratio (length to diameter), for example, of about 2 or higher, and having various cross sectional shapes including, but not limited to, cylindrical and elliptical shapes. In various embodiments, the filament structure 120 can include, for example, closely packed (or dense) carbon filaments with each filament having a diameter of about 10 micron or less. In one embodiment, the filament structure 120 can include carbon fibers and can be closely packed, randomly oriented, and/or highly twisted. Such filament structures can be strong enough to tolerate high sheer strains.

The metal template 115 can include one or more metal surfaces that are used as templates for the growth of the filament structures. That is, the morphologies, shapes and structures of the formed filament structures can mimic the morphologies, shapes and structures of the mating metal template. For example, the macroscopic shapes of the produced filament structure 120 can be controlled by choosing a desired shape of the template surface 115. This is because the growth of the filament structure 120 can largely follow the morphology/shape/structure of the template surface 115 in the growth direction. The shapes and/or geometries of the formed filament structures can thus be controlled by pre-shaping the template surface having a corresponding shape and/or geometry.

In various embodiments, the metal template 115 can include any metals having appropriate catalytic capabilities including, but not limited to, palladium, platinum, nickel, cobalt, rhodium, or mixtures thereof. In various embodiments, other template materials can also be used including, but not limited to, a graphite or a filamentous carbon, in the form of, for example, a fiber and a fabric. In various embodiments, the metal template 115 can be patterned (e.g., in arrays) or un-patterned on the template substrate 110. For example, as shown in FIG. 1B, the metal template 115 can be patterned to have one or more metal surfaces, such as finely divided metal surfaces, formed wholly or in part on the template substrate 110 with each metal surface having different shapes. The finely divided metal can have, for example, crystals of about 100 microns or smaller. Carbon filament structures can then be grown on each metal surface and can have corresponding patterns and shapes to the metal template. In various embodiments, the metal template 115, patterned or non-patterned, can cover the template substrate 110 in whole or in part.

In various embodiments, the metal template 115 can be a thin layer formed over the template substrate 110, wherein the template substrate 110 can be formed using the same or different materials from the template surface 115. For example, the template substrate 110 can include a non-catalytic metal, such as aluminum, a ceramic, such as silica, or a semiconductor such as silicon. In various embodiments, the metal template on the template substrate can include, for example, a thin surface film of metal over a non-metallic substrate, a metal nanowire embedded in a silicon substrate, a large crystal of pure metal, a polycrystalline shaped metal article, a carbon nanotube, etc.

Various embodiments also include a method for preparing filament structures over one or more metal template surfaces. In an exemplary embodiment a metal template can be formed by sputtering a metal (e.g., Pd) onto the surface of a silica substrate to create a finely divided metal film on the silica. For example, the filament structures can be formed by first exposing the metal template to a fuel rich gaseous mixture.

As used herein, unless otherwise specified, the term "fuel rich gaseous mixture" refers to a gaseous mixture that includes fuel(s) or combustible gas(es), such as hydrocarbon(s), along with oxidizer(s) for a combustion reaction with the fuels, wherein there is a ratio between the amount of hydrocarbon(s) and the amount of oxidizer(s) to make the gaseous mixture "fuel rich" or to make the related combustion process "fuel rich". For example, the amount of the oxidizer(s) in the gaseous mixture can be insufficient to fully combust all of the fuel gases hydrocarbon(s), or the oxidizer(s) may partially combust the hydrocarbon(s) in a combustion process using the fuel rich gaseous mixture.

In the exemplary method for preparing the filament structures, the fuel rich gaseous mixture can be controlled to have a flow rate chosen to produce a turbulent flow in the formation system. The formation system, including the exposed template surface and the gaseous mixture, can then be heated to at least partially combust the hydrocarbon(s) and thereby forming the filament structure(s) on the template.

Figure 2:
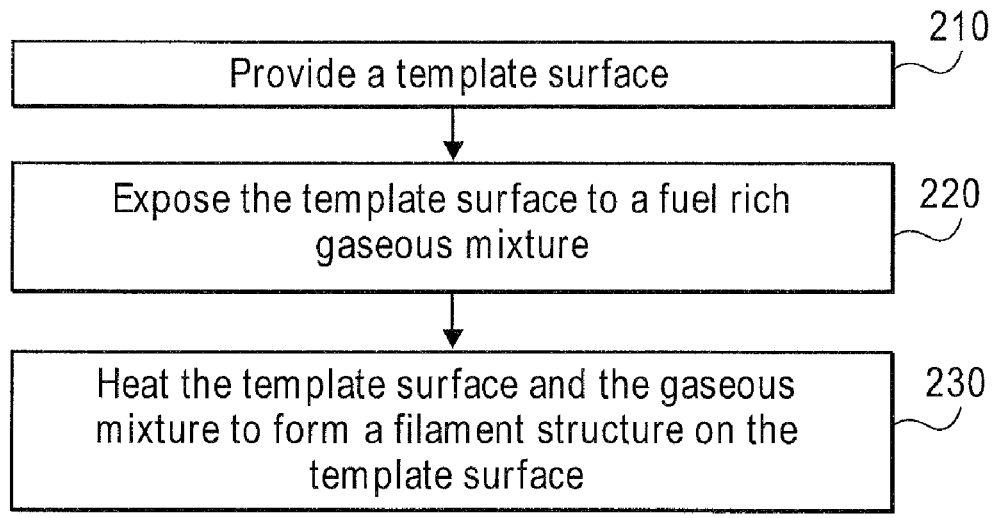
FIG. 2 depicts an exemplary method for forming filament structures in accordance with the present teachings.

FIG. 2 depicts an exemplary method for forming filament structures on a template surface in accordance with the present teachings. While the exemplary method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings.

At 210 of FIG. 2, a metal template can be provided or selected. For example, the metal template can include a thin, finely divided, layer of catalytic metal having a thickness of, e.g., about 500 Å. As disclosed herein, the metal layer can be patterned as desired or fully covered on a non-catalytic surface, for example, a non catalytic metal such as aluminum, a ceramic such as silica, or a semiconductor such as silicon. For example, the metal template can be prepared to possess a surface shape that corresponds to a shape of a desired filament structure. In various embodiments, the template surface can include, for example, foams, lattices, patterned arrays, thin films, wires, powders, and monoliths.

At 220, the metal template, or one or more metal surfaces of a patterned metal template, can be exposed to a "fuel rich" gaseous mixture. In one embodiment, the "fuel rich" gaseous mixture can be in a gas flow passing over the template surface(s) and ultimately form filament structure(s) thereon. The fuel rich gaseous mixture can contain one or more hydrocarbons and at least one oxidizer. In various embodiments, there may be insufficient oxidizer present in the fuel rich gaseous mixture to oxidize or combust all the hydrocarbon(s), even if the reaction proceeds to completion. The oxidizer can be, for example, oxygen, although other oxidizing gases known to one of ordinary skill in the art, such as ozone, can be substituted for oxygen. In various embodiments, the gaseous mixture can further include other gases, such as a chemically inert gas including, but not limited to, argon, nitrogen, and helium.

In addition, the gaseous mixture can have a high flow rate when exposed to the template surface(s). For example, the flow rate can be chosen to be able to generate turbulent flows over the template surface, such as with a Reynolds number greater than, for example, about 2300.

In various embodiments, the filament structures, such as the filament structure 120 of FIGS. 1A-1B, can be formed on one or more individual spots of the template surface. In an exemplary embodiment, carbon filament structures, the non-graphitic structures, can be formed on one spot of a template surface, while a planar graphitic structure can be formed on another spot of same template surface at same time. The growth of graphitic articles can be found as described in the related U.S. patent application Ser. No. 11/364,980, entitled "Preparation of Graphitic Articles," which is incorporated by reference herein in its entirety.

At 230, filament structures can be formed or grown on the template surface(s) by, for example, heating the growth system including the gaseous mixture exposed to the template surface(s). For example, when exposing the gaseous mixture to the template surface(s), an exemplary temperature ranging from about 100° C. to about 1000° C. can be used. In various embodiments, the system pressure can also be controlled during the formation process. An exemplary pressure ranging from about 0.01 Torr to about 760,000 Torrs (i.e., 1000 atmospheres) can be used.

In various embodiments, at an appropriate temperature, in an appropriate gas mixture, a thick array of filament structures can be grown selectively on only metal surfaces, e.g., in a matter of seconds. Any two or even three dimensional shape of high density carbon filament structure can be generated in this fashion, by pre-shaping the metal catalyst template to a desired shape, and controlling the length of time the metal template is exposed to the gaseous mixture.

In various embodiments, the template surface/substrate can be removed, for example, by dissolving away the exemplary metal template surfaces and leaving self-supporting filament structures.

In various embodiments, there can be a "sweet region" in the formation reactor for the growth of the filament structures. The growth can be influenced by the identity of the radical species formed in the gas phase and directly above or on the surface of the growing carbon filament structure. The precise position of the "sweet region" can be determined empirically for certain reactor configurations. Filamentous structures, the non-graphitic structures, can be distinguished from the graphitic structure using, e.g., Raman spectroscopy and Electron microscopy.

In various embodiments, the growth of the filament structures can be fast using simple, standard, and scalable equipment with controllable macroscopic and microscopic morphologies and minimized post-material generation processes. The filament structures (e.g., carbon fibers) can be conveniently cast on large surface areas, for example, a large part of a vehicle including, but not limited to, a truck, an automobile, a ship, a spaceship, and an airplane. The formation of the filament structures can also be incorporated with epoxy to be grown in a desirable shape in a very short time frame (e.g., <1 hour). The filament structures (e.g., carbon fibers) can also be selectively grown as components of complex, nano-scale, three dimensional objects. For example, in multi-level integrated circuits, vias between levels e.g., vias as small as a few nanometers, can be selectively filled with carbon based filament structures used for thermal management or possibly current carrying applications.

In addition, the formed closely packed objects (e.g., filament films or filament structures shown in FIGS. 1A-1B) can be used for applications that require high strength-to-weight ratio and/or structural integrity at high shear stresses, such as, for example, for air frame structures, sports equipment, automobile parts, and armor applications. For example, forming graphitic filament on structural fiber (e.g., carbon, kevlar, etc.) surfaces can enable a quantum improvement in the mechanical/energy absorption characteristics of the new structural composites leading to better blast resistance.

Figure 1C:
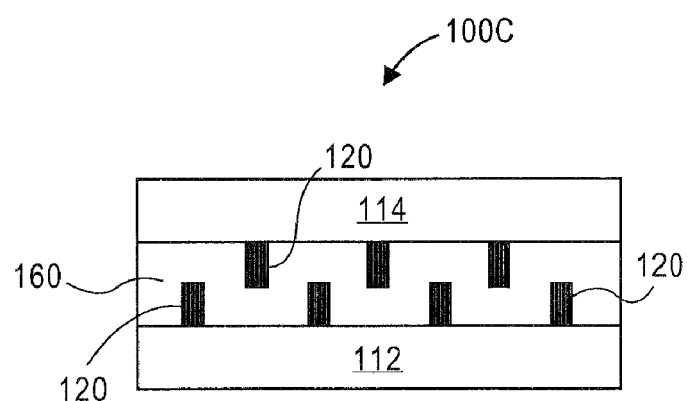
FIG. 1C is a schematic cross-sectional view of an exemplary photo-voltaic cell including filament structures in accordance with the present teachings.

Further, as shown in FIG. 1C, the closely packed filament objects (e.g., filament films or filament structures 120 shown in FIGS. 1A-1B) can be used in an organic photo-voltaic cell 100C in accordance with the present teachings. The exemplary photo-voltaic cell 100C can include electrodes 112/114 with each electrode having a plurality of filament structures 120 attached thereto. The exemplary photo-voltaic cell 100C can also include an organic material 160, such as a hole-carrier polymer, disposed between the two electrodes 112/114. Any electrodes, polymers or other materials used for photo-voltaic cells that are known to one of ordinary skill in the art can be used for the disclosed photo-voltaic cell 100C.

In this manner, the closely packed carbon filament structure attached to the electron carrier electrode (112/114) can increase the density of attached or activated dye on the anode of the cell 100C. The photo-voltaic cell 100C can thus provide a framework for attaching dyes to graphite or carbon filament sections (see 120) of a variety of geometries, and provide a high mobility (low recombination) path for electrons to the electrode after the exciton formation at the dyes.

In addition, the disclosed methods for generating filaments and filament structures of carbon and/or graphite can provide the many advantages to photo-voltaic cells. Firstly, any geometry can be grown on any substrate surface of any scale. Secondly, the graphite can be grown directly in place such that the entire circuit, and/or the graphite/electrodes can be created easily. Thirdly, all of the carbon/graphite can form a continuous circuit without multiple junctions.

In various embodiments, a filament coated article can be prepared. For example, the filament coated article can be prepared by first placing a selected template into a container that is incorporated with a tube furnace. A gaseous mixture containing hydrocarbon(s) and oxidizer(s) can then be introduced into the container with a flow rate chosen to produce a turbulent flow. The template placed in the container can be heated by the tube furnace to a temperature so as to at least partially combust the hydrocarbon(s). As a result, a filament object can be deposited on the template.

The following examples are illustrative of the invention and its advantageous properties, and are not to be taken as limiting the disclosure or claims in any way. In this example, as well as elsewhere in this application, all parts and percentages are by volume unless otherwise indicated.

EXAMPLES

Flat 0.5" Square Films Formed on a Thin Pd Surface Layer Sputtered on Silica

In this example, carbon filament structures were formed on a metal Pd template surface that was formed on a silica substrate. The formation included template creation, template pretreatment, filament generation as described below.

To create the metal template surface, a template substrate was prepared by oxidizing a high purity standard 6" undoped Si wafer at about 1000° C. in air for about 12 hours to generate a silicon oxide film. The oxide film possessed a thickness of several thousand angstroms in order to prevent a possible formation of silicide during the following processes. Metal Pd film having a thickness of about 600 Å was then sputter-deposited onto the oxide surface using Ar ions and a Pd target. The resulting Pd coated wafer was mechanically broken into squares with each square having an area of about 0.5"×0.5". These pieces are hereafter referred to as the "templates".

The template pieces were then cleaned. The template pieces were washed with ethanol and dried with lint free cloth in order to remove gross contamination.

Figure 3:
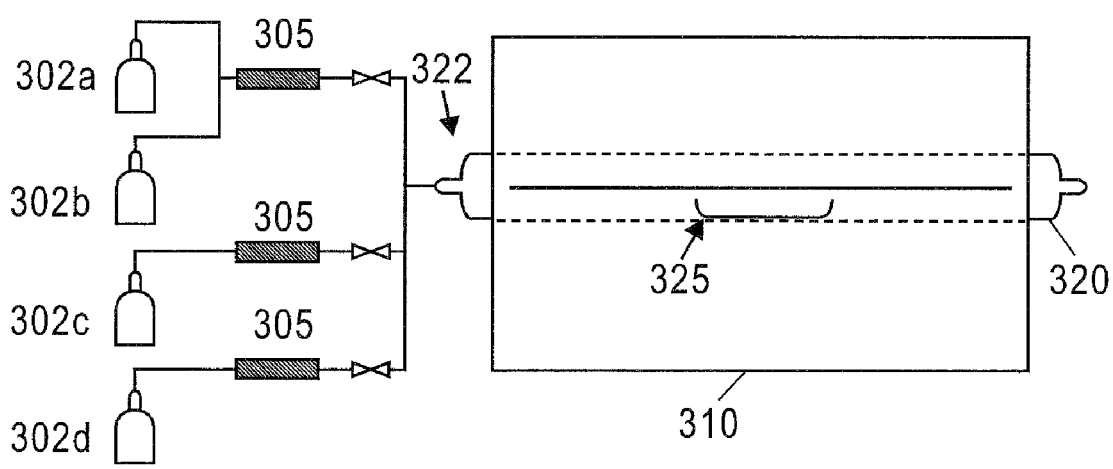
FIG. 3 depicts an exemplary system for preparing filament structures in accordance with the present teachings.

The cleaned template piece was then placed in a container for forming desired filament structures thereon. FIG. 3 depicts an exemplary preparation system 300 for the filament structures with standard laboratory equipment. As shown, the preparation system 300 includes a gas flow controller 305 for each gas to be introduced from various gas cylinders including 302a-d, a tube furnace 310, and a container 320, for example, a quartz glass ware such as a quartz tube of about 1" in diameter and about 2" in length that fits the furnace 310 The preparation system 300 may further include a sample holder 325 for holding any work piece, such as the template pieces.

In one embodiment for forming the filament structures, a prepared and cleaned template piece was put into the quartz glass ware 320, wherein the quartz glass ware 320 was situated such that the center of the template was about 3" from the gas inlet edge 322 of the tube furnace 310. The container 320, the quartz glass ware, was evacuated with a rough pump in order to remove oxygen gas therefrom, followed by purging the tube with gas argon to reach a pressure of about 500 Torr. This pressure was maintained thereafter Argon flow rate was maintained at about 100 cc/min (STP), when the oven/furnace was heated for a target temperature of about 560° C. Once the temperature of 560° C. was reached, the Ar gas was replaced by a gas flow including $H_2$ (6%) and Ar at a pressure of about 500 Torr for about one hour to pre-treat the template in the container 320. In this case, surface contamination of the template (e.g., surface oxide on the Pd film) was removed The system was then flushed with pure Ar for one hour to remove hydrogen prior to the introduction of the filament growth gaseous mixture.

Filament structures were then generated on the $H_2$ pre-treated template pieces. Immediately after the completion of the template pre-treatment as described above, the gas mixture was changed to a "growth gaseous mixture" including 90% Ar, 6.6% oxygen and 3.3% ethylene by volume with a flow rate of about 100 cc/min; a temperature of about 560° C.; and a pressure of about 500 Torr. These conditions were maintained for about 90 minutes for the growth of the dense filament structures. After the growth, the gas flow was stopped; the system was pumped out; and the system was cooled down. The cooling process was used to 'freeze' the filament growth after the specified time period (e.g., about 90 minutes.)

After the growth process, in some cases, a black film object including packed filaments, was observed on the template surface. Compression stress cracks were also observed in the filament film leading to film segments breaking free of the underlying template surface. For example, cracked filament film object in large dimensions (e.g., more than about 1 micron) was observed and separated from the underlying metal template surface coated flat on silica substrate. Similar stress cracks were also observed for metal films on ceramic substrates. The stress cracks are believed to occur during the cooling process because of different thermal expansion coefficients between the filament film and the underlying material. In various embodiments, the radial stresses that lead to crack can be minimized and/or eliminated by avoiding the filament growth at the center of the template substrate, which can in turn be obtained by avoiding metal deposition at the center of the template substrate.

In an exemplary embodiment, the resulting filament film objects were measured to be about 10 microns thick across the entire surface of the template, which suggests that the film grew at a rate of about 100 nm/min. In addition, the formed carbon filaments were observed to entirely or at least primarily cover the template surface. Further, the filament films included carbon fibers that were closely packed, randomly oriented, and highly twisted, forming a strong structure that tolerates a high sheer strain. The carbon fibers of the filament structure have a diameter ranging from about 3 nm to about 50 nm.

In various embodiments, Raman spectroscopic results indicated that filamentous structure is the sole structural form of the formed black film object (e.g., the rug-like unique structure). There is no evidence for the existence of planar graphitic structures in this example, although planar graphitic structures can be formed on another spot of the same template piece if necessary.

In this manner, the non-graphitic filament structures with controlled geometries can be formed using the disclosed methods, which provide many advantages over conventional methods in the prior art. For example, first, in prior art of carbon filament growth, a reducing atmosphere wherein there is no oxygen involved was required. Second, the disclosed methods can be used for growing dense filament structures in a clearly defined fashion. Third, the disclosed methods can grow filaments from thin metal films. Fourth, in the prior art for graphite growth from hydrocarbon/oxygen mixtures, only oxygen was listed as an oxidizer.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for preparing a filament structure comprising:
    exposing a template to a fuel rich gaseous mixture comprising one or more hydrocarbons and at least one oxidizer, wherein the fuel rich gaseous mixture has a flow rate chosen to produce a turbulent flow over the template; and
    heating the fuel rich gaseous mixture and the template to a temperature sufficient to form a woven carbon filament film on the template, wherein the template comprises a catalytic metal and the woven carbon filament film comprises a non-graphitic carbon structure.

2. The method of claim 1, further comprising forming a patterned metal template comprising one or more metal surfaces, wherein the filament structure is grown on each metal surface mimicking a shape of the metal surface in the growth direction.

3. The method of claim 1, wherein the metal template comprises a finely divided catalytic metal.

4. The method of claim 3, wherein the catalytic metal comprises a noble metal.

5. The method of claim 3, wherein the finely divided catalytic metal comprises palladium, platinum, nickel, colbalt, rhodium, or mixtures thereof.

6. The method of claim 1, wherein the metal template is selected from the group consisting of a foam, a lattice, a patterned array, a thin film, a wire and a monolith.

7. The method of claim 1, further comprising controlling an exposure time of the metal template to the fuel rich gaseous mixture so as to control a growth length of the filament structure.

8. The method of claim 1, wherein the metal template at least partially covers a substrate that comprises a non-catalytic metal, a ceramic, or a semiconductor.

9. The method of claim 1, further comprising incorporating epoxy into the formation of the filament structure.

10. The method of claim 1, wherein the fuel rich gaseous mixture and the template surface are heated at the temperature of about 100° C. to about 1000° C.

11. The method of claim 1, further comprising removing the metal template and leaving the formed filament structure.

12. The method of claim 1, further wherein a planar graphitic structure is formed on a portion of the metal template.

13. The method of claim 1, wherein the fuel rich gaseous mixture further comprises a chemically inert gas.

14. The method of claim 13, wherein the hydrocarbon comprises ethylene; the oxidizer comprises oxygen; and the chemically inert gas comprises argon, nitrogen, or helium.

15. A method for preparing a filament coated article comprising:
    placing a template into a container, wherein the template comprises one or more catalytic metal surfaces that at least partially cover the template;
    introducing a fuel rich gaseous mixture into the container, wherein the fuel rich gaseous mixture comprises one or more hydrocarbons and at least one oxidizer and has a flow rate chosen to produce a turbulent flow over the template; and
    heating the template to a temperature chosen to at least partially combust the one or more hydrocarbons, thereby depositing a woven carbon filament film on each of the one or more catalytic metal surfaces of the template, wherein the woven carbon filament film comprises a non-graphitic carbon structure.

16. The method of claim 15, further comprising preparing the template having the one or more catalytic metal surfaces and pre-treating the one or more catalytic metal surfaces prior to the introduction of the gaseous mixture.

17. The method of claim 16, wherein the preparation of the template comprises:
    forming a silicon oxide film on a silicon wafer; and
    depositing a catalytic metal palladium film on the formed silicon oxide film, wherein the palladium film is finely divided and has a thickness of about 500 angstroms.

18. The method of claim 15, further comprising controlling a shape of the filament film in the deposition direction by mimicking a shape of an underlying catalytic metal surface.

19. The method of claim 15, further comprising a cooling process to freeze the deposition of the filament film.

20. The method of claim 15, further comprising depositing a carbon filament film to fill a via structure between levels of a multi-level integrated circuit.

21. The method of claim 15, further comprising depositing a filament film on a large part of a vehicle comprising a truck, an automobile, a ship, a spaceship, and an airplane.

22. A method for preparing a filament coated article comprising:
    forming a patterned metal template and placing the patterned metal template into a container comprising a tube furnace;
    pre-treating the patterned metal template in the container;
    introducing a fuel rich gaseous mixture comprising one or more hydrocarbons and oxygen into the container with a flow rate chosen to produce a turbulent flow;
    heating the patterned metal template to a temperature chosen to at least partially combust the one or more hydrocarbons, whereby a patterned woven carbon filament film is deposited on the patterned metal template, wherein the template comprises a catalytic metal and the woven carbon filament film comprises a non-graphitic carbon structure; and
    cooling the container to freeze the deposition of the filament film.

23. The method of claim 22, wherein the fuel rich gaseous mixture further comprises a chemically inert gas comprising argon, nitrogen, or helium.

* * * * *

UNITED STATES PATENT AND TRADEMARK OFFICE
CERTIFICATE OF CORRECTION

PATENT NO.            : 8,298,615 B2                                    Page 1 of 1
APPLICATION NO.       : 12/355265
DATED                 : October 30, 2012
INVENTOR(S)           : Claudia C. Luhrs et al.

It is certified that error appears in the above-identified patent and that said Letters Patent is hereby corrected as shown below:

In the Specification

Column 1, after the first paragraph, please insert the following paragraph:

--Government Rights

This invention was made with Government support under Grant No. DE-AC52-06NA25396 DOE/NNSA awarded by Los Alamos National Laboratory. The U.S. Government has certain rights in the Invention.--

Signed and Sealed this
Eleventh Day of November, 2014

Michelle K. Lee
*Deputy Director of the United States Patent and Trademark Office*